United States Patent [19]
Greer

[11] Patent Number: 5,196,753
[45] Date of Patent: Mar. 23, 1993

[54] SURFACE ACOUSTIC WAVE DEVICES HAVING LONG-TERM FREQUENCY STABILITY

[75] Inventor: James A. Greer, Andover, Mass.

[73] Assignee: Raytheon Company, Lexington, Mass.

[21] Appl. No.: 783,720

[22] Filed: Oct. 25, 1991

Related U.S. Application Data

[63] Continuation of Ser. No. 566,750, Aug. 13, 1990, abandoned.

Foreign Application Priority Data

Jul. 31, 1989 [JP]  Japan ................................. 1-198648

[51] Int. Cl.$^5$ ............................................. H01L 41/08
[52] U.S. Cl. ............................ 310/313 B; 310/313 D; 333/154; 333/195
[58] Field of Search ............ 310/313 B, 313 D, 313 R; 333/153, 154, 195, 196

[56] References Cited

U.S. PATENT DOCUMENTS

| | | | |
|---|---|---|---|
| 4,130,813 | 12/1978 | Sandy et al. | 310/313 D X |
| 4,353,046 | 10/1982 | Hartmann | 310/313 D X |
| 4,464,597 | 8/1984 | Setsune | 310/313 B |
| 4,499,440 | 2/1985 | Grudkowski | 310/313 R X |
| 4,890,369 | 1/1990 | Tanski | 310/313 D X |
| 4,910,839 | 3/1990 | Wright | 310/313 B X |
| 4,916,348 | 4/1990 | Beggs et al. | 310/313 D X |
| 4,933,588 | 6/1990 | Greer | 310/313 D |
| 4,978,879 | 12/1990 | Satoh et al. | 310/313 D X |

*Primary Examiner*—Mark O. Budd
*Attorney, Agent, or Firm*—Richard M. Sharkansky

[57] ABSTRACT

A surface acoustic wave device includes a substrate having a surface which supports surface acoustic wave propagation and having a pair of interdigitated transducers disposed thereon. Each of the pair of interdigitated transducers has a set conductive members. To improve the ratio of devices having acceptable long-term frequency stability characteristics to those without such acceptable characteristics, the conductive members of the pair of interdigitated transducers have a larger than conventional thickness.

3 Claims, 4 Drawing Sheets

SURFACE ACOUSTIC WAVE DEVICES HAVING LONG-TERM FREQUENCY STABILITY

This application is a continuation of application Ser. No. 566,750 filed Aug. 13, 1990 now abandoned.

BACKGROUND OF THE INVENTION

This invention relates generally to surface acoustic wave devices, and more specifically to techniques for providing such devices with acceptable long-term frequency stability.

As it is known in the art, surface acoustic wave (SAW) devices, such as resonators and delay lines, are used in a variety of applications. Generally a surface acoustic wave device comprises a pair of interdigitated transducers (IDTs), which are the input and output ports of the device, with each transducer having a set of conductive members, typically metal, disposed on or recessed within an upper portion of a surface which supports surface acoustic wave propagation.

As it is also known in the art, the thickness of conductive members comprising interdigitated transducers is determined by the desired device characteristics. The metal thickness of such conductive members will have an effect on the resonant, or center, frequency of the device and the quality factor, Q, of the device. A slight variation may also be observed in the overall losses of a SAW device as such metal thickness is varied. Based on trade-offs of these effects, conventional SAW devices have interdigitated transducers having conductive members with metal thickness ranging from 1.0% to 1.2% of an acoustic wavelength at the center frequency of the device.

As it is also known in the art, many SAW device applications require relatively constant frequency characteristics over long periods of time. The variation of frequency characteristics of a device with time is often referred to as the long-term frequency stability. Long-term frequency stability is measured in parts per million per year (ppm/year) and a typical requirement is 1 ppm/year averaged over a ten year period. The long-term frequency stability requirement of 1 ppm/year is readily met by devices which are operated at sufficiently low power levels and at frequencies below 600 MHz. However, at frequencies higher than 600 MHz a percentage of such devices will typically vary significantly more than 1 ppm/year.

The aging mechanism, which causes the frequency characteristics of a device to vary over time, in high frequency SAW devices is not fully understood at this time. It may be activated by either acousto-migration or electro-migration of impurities into the grain boundaries between adjacent crystals of the IDTs. Acousto-migration is a phenomenon in which metal portions of a device are displaced due to mechanical vibrations and electro-migration refers to the displacement of such metal portions due to electric current. Since the cause of poor long-term frequency stability is not fully understood, such characteristics are not easily improved. Presently, in providing SAW resonator devices, a common goal is simply to separate or weed out those devices which display poor long-term frequency stability characteristics.

One technique known in the art for separating devices having good long-term frequency stability characteristics from those without such desired characteristics is to "pre-age" the devices by operating them for a predetermined period, generally on the order of several months, in order to observe any devices not having a desired long-term frequency stability characteristic. Such a process requires that each SAW device be set up in a temperature stabilized environment and its frequency frequently monitored. The delivery time of such "pre-aged" devices is greatly increased by the duration of such testing. Moreover, both the time required to monitor device frequency characteristics and the test equipment employed will significantly increase the overall cost of the devices. Additionally, in order to ship a specified quantity of devices, an additional quantity must be fabricated and tested in the anticipation of failures. The cost associated with these "extra" devices, above the shipment quantity, must also be factored into the cost of "pre-aged" devices, thereby increasing their cost. This is particularly true since often SAW devices are custom ordered with respect to frequency characteristics. Such devices which do not meet specification for aging or which are extra and do meet specification for aging nevertheless may not be suitable for sale to another customer due to potentially different specifications for frequency characteristics.

SUMMARY OF THE INVENTION

In accordance with the present invention, a surface acoustic wave device includes a surface which supports surface acoustic wave propagation and having disposed thereon at least one interdigitated transducer (IDT) coupled to the surface wave propagation surface. The at least one transducer has a set of conductive members comprised of metal and having a thickness greater than 1.5% of the acoustic wavelength at the center frequency of the device. With such an arrangement, the ratio of devices having acceptable long-term frequency stability characteristics to those without acceptable characteristics is increased.

In accordance with a further aspect of the present invention, a surface acoustic wave resonator includes a surface which supports surface acoustic wave propagation and an input interdigitated transducer and an output interdigitated transducer coupled to said surface. The surface acoustic wave propagation surface further supports two sets of reflective gratings with the pair of IDTs disposed therebetween. Here such conductive members are comprised of metal and have a thickness greater than 1.5% of the acoustic wavelength at the center frequency of the device. Preferably, the metal thickness is between about 1.5% and 2.0% of the acoustic wavelength at the center frequency of the device, since below about 1.5% the ratio of devices having acceptable long-term frequency stability characteristics to those without acceptable characteristics is not significantly increased whereas above 2.0% degradation of the quality factor (Q) of the device may become significant for certain applications. In applications where significant degradation of the quality factor (Q) may be tolerated, thickness greater than 2.0% may of course be used. With this particular arrangement, the ratio of devices having acceptable long-term frequency stability characteristics to those without acceptable characteristics is increased over a similar ratio of devices having conventional metal thickness between 1.0% and 1.2% of the acoustic wavelength at the center frequency of the device.

BRIEF DESCRIPTION OF THE DRAWINGS

The foregoing features of this invention, as well as the invention itself, may be more fully understood from the following detailed description of the drawings, in which.

DESCRIPTION OF THE PREFERRED EMBODIMENTS

Figure 1:
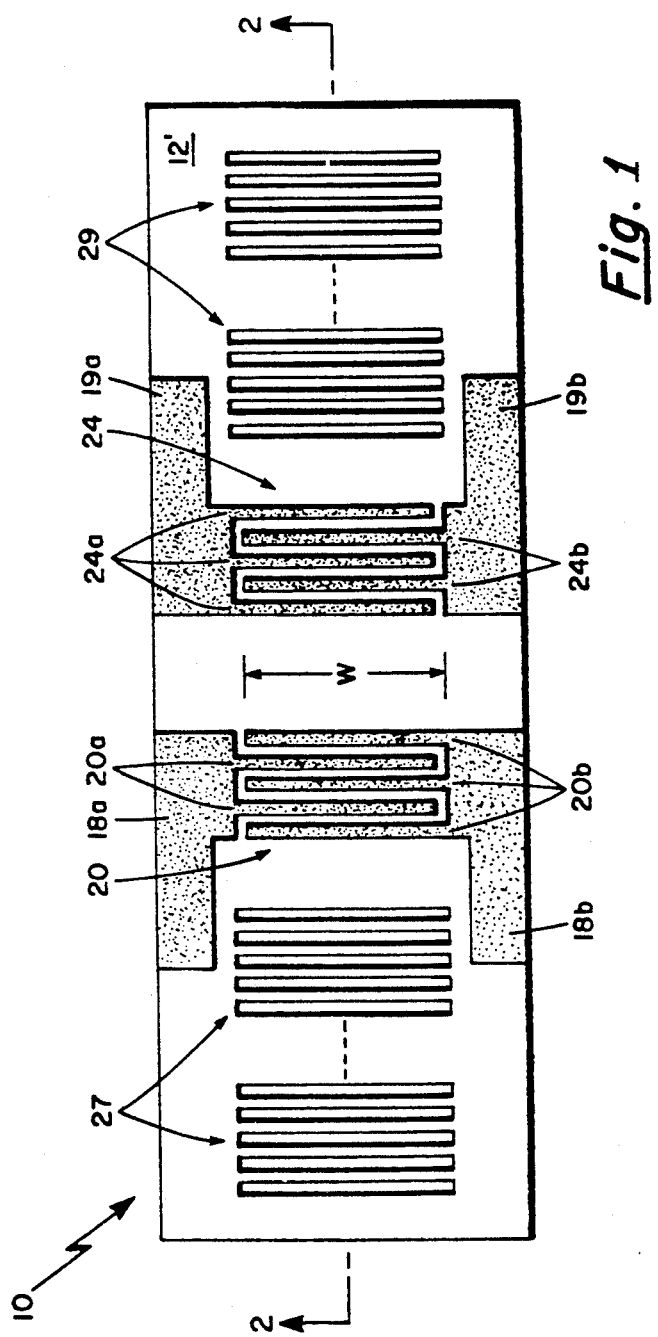
FIG. 1 is a plan view of a SAW resonator in accordance with the present invention.
Figure 2:
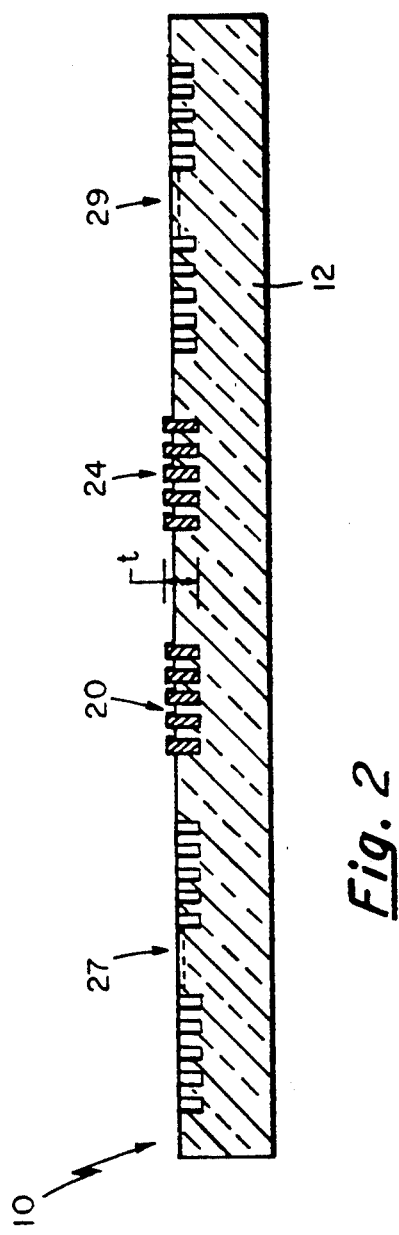
FIG. 2 is a cross-sectional view taken along lines 2—2 of FIG. 1.

Referring now to FIGS. 1 and 2, a SAW device, here a resonator 10, includes a substrate 12 having a surface 12' which supports surface acoustic wave propagation. Substrate 12 is here a rotated Y-cut of quartz, alternatively ST-cut quartz, as well as various other rotated cuts of quartz, and other substrate materials may be used. Substrate 12 supports at least a pair of interdigitated transducers (IDTs), here one pair 20 and 24, but more than one pair may be used in a parallel configuration in order to increase the power handling capability of the SAW resonator device 10. The substrate 12 further supports two sets of reflective gratings 27 and 29. The interdigitated transducers 20 and 24 are the input and output ports of the device, and the reflective gratings 27 and 29 act as "mirrors" for the acoustic energy. By reflecting acoustic energy, the reflective gratings 27 and 29 confine such energy to the center of the SAW resonator 10. The interdigitated transducers 20 and 24 are each comprised of conductive members 20a, 20b and 24a, 24b, here copper doped aluminum, although other metal systems may alternately be used. For example, aluminum doped with titanium and copper may be used as described in U.S. patent application entitled "High Power Surface Acoustic Wave Devices Having Long-Term Frequency Stability," inventors James A. Greer, Thomas E. Parker, and Gary K. Montress, U.S. Pat. No. 5,039,957 filed concurrently herewith, and assigned to the assignee of the present invention. Such members 20a, 20b and 24a, 24b are each coupled to the respective one of bus bars 18a, 18b and 19a, 19b as shown. Furthermore, the conductive members 20a, 20b and 24a, 24b may be supported on the surface 12' of substrate 12 or may be recessed within grooves provided in the substrate 12. Here such conductive members 20a, 20b and 24a, 24b are recessed within grooves in substrate 12 as shown in FIG. 2. The conductive members 20a, 20b and 24a, 24b have a metal thickness, "t" (as shown), greater than 1.5% of the acoustic wavelength at the center frequency of the device 10, preferably between 1.5% and 2.0% of the acoustic wavelength at the center frequency of the device 10. Here, the metal thickness is 2.0% of the acoustic wavelength at the center frequency of the device 10. Where the substrate 12 is comprised of quartz, the acoustic wavelength is 3,159 meters/second divided by the center frequency of the device 10. Thus, a device operating at 810 MHz will have an acoustic wavelength of 3.9 micrometers and a metal thickness equal to 2.0% of the acoustic wavelength is 780Å.

SAW devices having conductive members with increased metal thickness provide an improvement in the ratio of those devices which display acceptable long-term frequency stability characteristics to SAW devices without such acceptable characteristics over a similar ratio for devices having a conventional, lesser metal thickness, which as mentioned is between 1.0% and 1.2% of the acoustic wavelength at the center frequency of the device. In addition to improving the ratio of "acceptable" to "unacceptable" SAW devices with respect to long-term frequency stability characteristics, other effects on the device characteristics will be a decrease in the center frequency of the device and/or a slight degradation in the quality factor, Q, of the device. While the slight decrease in the center frequency of the device can be quantified and thus compensated for in the device design, the possible degradation in the quality factor, Q, of the device may be of concern in applications where high Q is a critical factor. Such applications would be those in which a narrow bandwidth is required since, due to their inverse relationship, a high Q indicates a narrow bandwidth. However, in many applications, the slight degradation in the quality factor resulting from increasing the metal thickness to between 1.5% and 2.0%, or higher, of the acoustic wavelength at the center frequency of the device would be acceptable.

Insertion loss, which is both a function of resistive losses and losses dependent on the amount of mass which must be moved in the propagation of surface waves, has been found to remain relatively constant with the described increase in metal thickness. This results because while the increase in metal volume decreases the overall resistance of the conductive members 20a, 20b and 24a, 24b, thereby decreasing insertion loss, the resulting increase in the mass of the transducers will increase the overall losses; such effects tending to cancel each other.

It is believed that the improvement in the ratio of SAW devices having acceptable long-term frequency stability characteristics to SAW devices without such acceptable characteristics provided with increased metal thickness of the conductive members of the IDTs of the device may be due to the inherent reduction of current density in such conductive members and also the increase in grain boundary size. The width of the conductive members of IDTs is a function of the center frequency of the device. A device having a center frequency of 810 MHz will have conductive members approximately one micron wide. Thus, the cross-sectional area of a conductive member having a conventional metal thickness, for example a metal thickness of 1.0% of the acoustic wavelength at 810 MHz, is 0.05 square micrometers. A conductive member with a thickness in accordance with the present invention, here 2.0% of the acoustic wavelength at 810 MHz, has a cross-sectional area of 0.10 square micrometers. Doubling the cross-sectional area of the conductive members will decrease the current density in the conductive members by a factor of two. In turn, this reduction in current density may provide a concomitant decrease in the aging characteristics of SAW devices due to electro-migration.

The grain boundary area between adjacent crystals in a thick conductive member will be increased due to the increase in the metal thickness of such a conductive member. By increasing the metal thickness from the conventional 1.0% of the acoustic wavelength at the center frequency of the device to 2.0% of the acoustic wavelength at the center frequency of the device, the metal thickness is doubled, and the grain boundary height is also doubled. The increase in grain boundary height increases the area along which precipitated impurities may migrate. Thus, for each migrating impurity, the effect on the overall device properties is reduced compared to a device having conductive members of conventional metal thickness.

Figure 3:
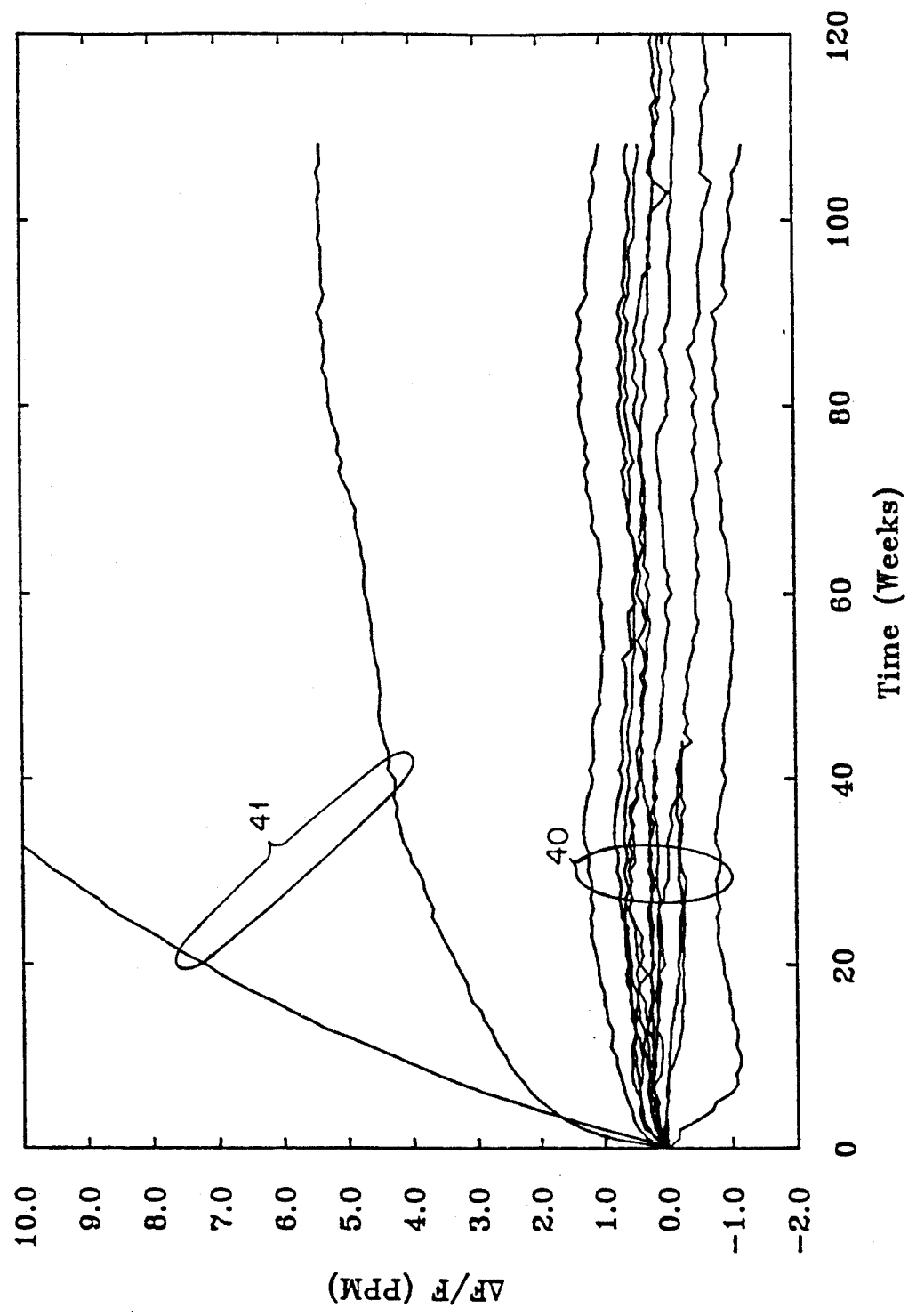
FIG. 3 is a plot of frequency variation (in ppm) versus time (in weeks) showing long-term aging characteristics of SAW resonator devices having conventional metal thickness.

Referring now to FIG. 3, the frequency aging characteristics of fourteen SAW resonator devices having transducers with conductive members of conventional metal thickness, between 1.0% and 1.2% of an acoustic wavelength at the center frequency of the device, is shown. Here, the center frequency of the devices is between 720-950 MHz and the conductive member metal thickness is 1.0% to 1.2% of the acoustic wavelength at the center frequency of the device, or 300-500 Å. Based on a typical long-term frequency stability requirement of a variation of less than 1 ppm/year, 12 out of the 14 SAW resonator devices show acceptable aging characteristics 40. However, two of the devices are aging at an unacceptably high rate 41.

Figure 4:
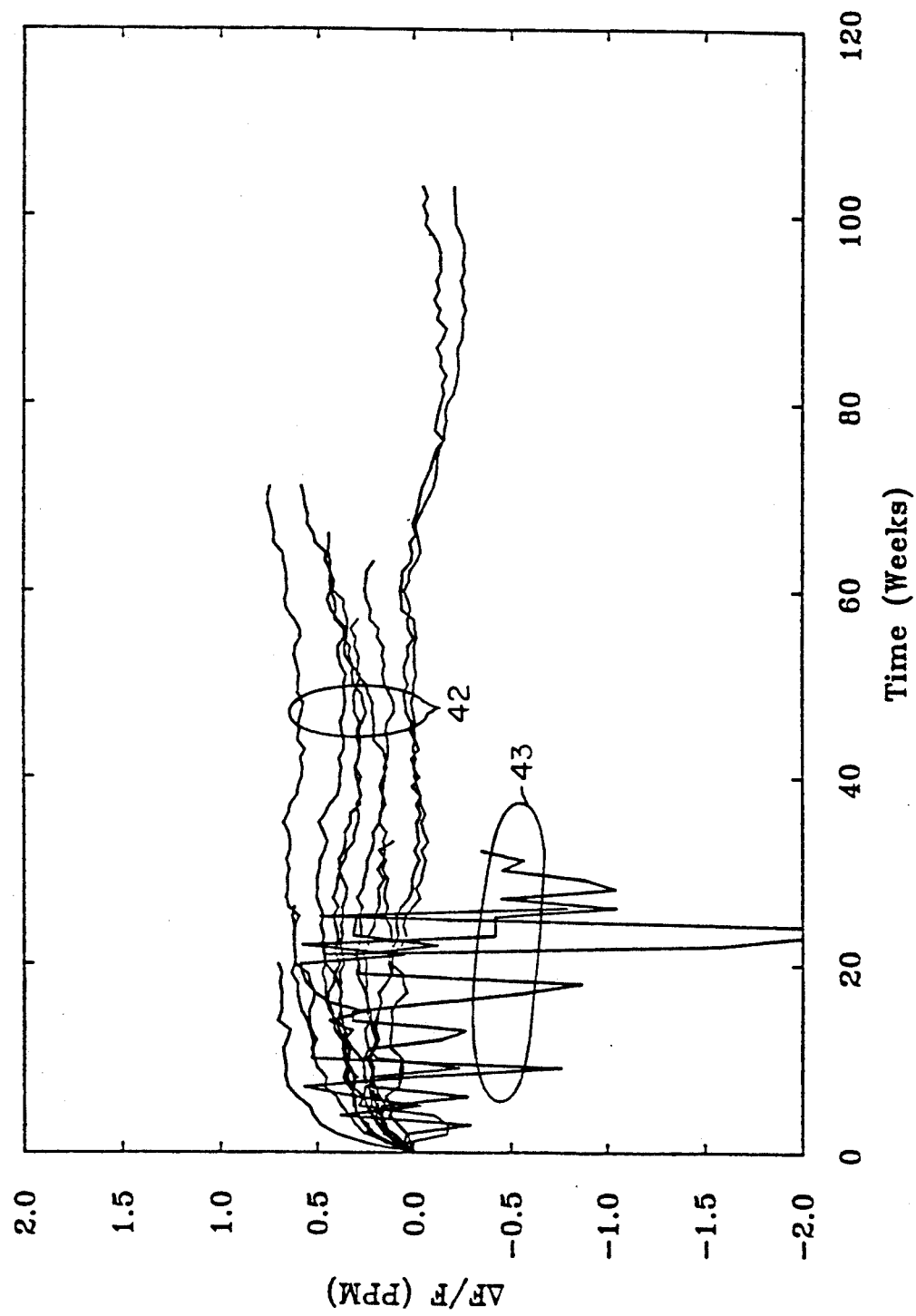
FIG. 4 is a plot of frequency variation (in ppm) versus time (in weeks) showing the long-term aging characteristics of devices fabricated in accordance with the present invention.

FIG. 4 shows the frequency aging characteristics of fifteen devices fabricated in accordance with the present invention. These SAW resonators have conductive members having metal thickness of between 1.7% and 2.0% of the acoustic wavelength at the center frequency of the devices, here the center frequency is 810 MHz. As shown, three of the fifteen devices exhibit a frequency deviation greater than about 0.7 ppm over the specified durations 43 while the remaining 12 devices exhibit a frequency deviation of less than about 0.7 ppm over the specified durations 42. However, it has been determined that the erratic behavior of the three devices was due to defects in the amplifiers in the circuits in which the devices were operated.

The SAW devices are subjected to a relatively high temperature, above approximately 350° C., for a period of time in order to provide acceptable long-term frequency stability characteristics. This "baking" process anneals the metal portions of the device and eliminates any H₂O from the surface of the device prior to sealing.

Figure 5:
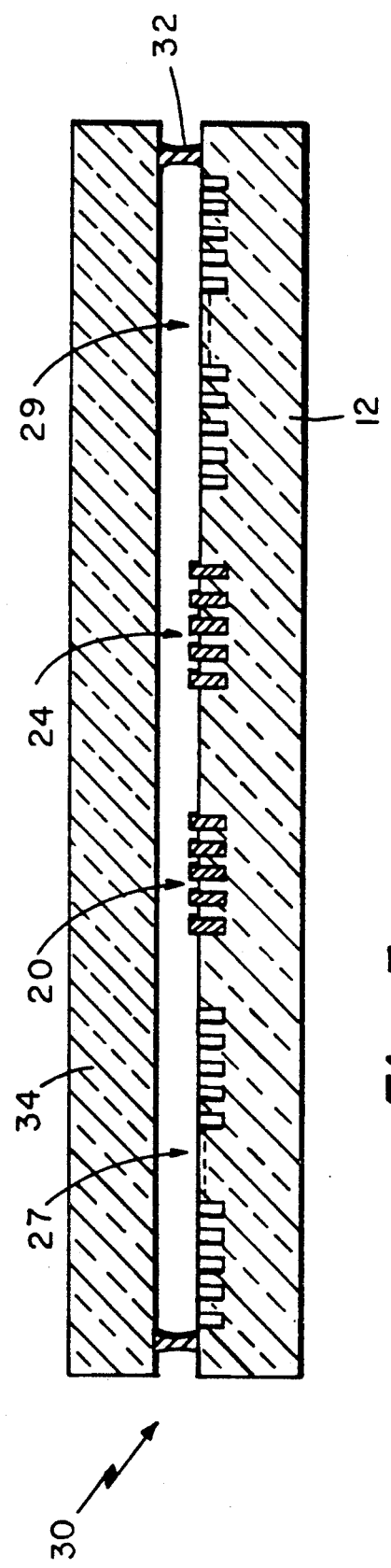
FIG. 5 is a cross-sectional view of the SAW device of FIGS. 1 and 2 sealed in a SAW device package.

Referring now to FIG. 5, the SAW resonator 10 (FIGS. 1 and 2) is sealed in a package 30, here in a conventional all-quartz package 30 provided from Raytheon Company Special Microwave Device Operation, Northboro, Mass., Raytheon Research Division, Lexington, Mass., or an equivalent, by providing a seal ring of a glass frit 32 between the substrate 12 and a crystallographic matched quartz cover 34 as shown. The cover 34 is chosen such that bus bars (not shown) are exposed along the longitudinal edges of the substrate 12. Other types of packages, such as the TO-8 can type, may alternately be used.

Having described preferred embodiments of the invention, it will now become apparent to one of skill in the art that other embodiments incorporating their concepts may be used. It is felt, therefore, that these embodiments should not be limited to disclosed embodiments, but rather should be limited only by the spirit and scope of the appended claims.

What is claimed is:

1. A surface acoustic wave device comprising:
   a quartz substrate having a surface which supports surface acoustic wave propagation, said surface having grooves disposed therein; and
   at least one transducer having conductive members disposed in said grooves in said surface with said conductive members having thicknesses between approximately 1.5% and 2.0% of the acoustic wavelength at the center frequency of the device.

2. A surface acoustic wave resonator device comprising:
   a quartz substrate having a surface which supports surface acoustic wave propagation, said surface having a plurality of grooves disposed therein;
   a pair of reflective gratings disposed in said surface acoustic wave propagation surface; and
   an input transducer and an output transducer coupled to said surface acoustic wave propagation surface and disposed between said pair of reflective gratings, each transducer having conductive members disposed in said plurality of grooves and said conductive members having thicknesses between approximately 1.5% and 2.0% of the acoustic wavelength at the center frequency of the device.

3. The device as recited in claim 2 wherein the quartz substrate is rotated Y-cut of quartz.

* * * * *